(12) United States Patent
Kan et al.

(10) Patent No.: US 6,743,709 B2
(45) Date of Patent: Jun. 1, 2004

(54) EMBEDDED METAL NANOCRYSTALS

(75) Inventors: Edwin C. Kan, Ithaca, NY (US); Zengtao Liu, Ithaca, NY (US); Venkatasubraman Narayanan, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 38 days.

(21) Appl. No.: 10/210,993

(22) Filed: Aug. 5, 2002

(65) Prior Publication Data

US 2002/0192949 A1 Dec. 19, 2002

Related U.S. Application Data

(62) Division of application No. 09/911,378, filed on Jul. 25, 2001, now Pat. No. 6,646,302.
(60) Provisional application No. 60/252,074, filed on Nov. 21, 2000.

(51) Int. Cl.[7] .......................................... H01L 21/4763
(52) U.S. Cl. .................... 438/622; 438/660; 438/725
(58) Field of Search .................. 438/610, 622, 438/625, 660, 725; 257/321, 770

(56) References Cited

U.S. PATENT DOCUMENTS

| | | |
|---|---|---|
| 5,559,057 A | 9/1996 | Goldstein |
| 5,679,171 A * | 10/1997 | Saga et al. ...................... 134/3 |
| 6,090,666 A * | 7/2000 | Ueda et al. ................... 438/257 |

OTHER PUBLICATIONS

J.R. Tucker, "Schottky barrier MOSFETs for Silicon nanoelectronics," Advanced Workshop on Frontiers in Electronics, WOFE'97 Proceedings, pp. 97–100, 1997.

C. Wang, J.P. Snyder and J.R. Tucker, "Sub–40 nm PtSi Schottky source/drain metal–oxide–semiconductor field–effect transistors," Appl. Phys. Lett, vol. 74, pp1174–6, 1999.

V. Narayanan, Z. Liu, Y.M.N. Shen, M. Kim and E.C. Kan, "Reduction of metal–semiconductor contact resistance by embedded nanocrystals," IEDM Tech. Dig., pp. 87–90, 2000.

E.C. Kan and Z. Liu, "Directed self–assembly process for nano–electronic devices and interconnect," Superlattices and Microstructures, vol. 27, pp. 473–9, 2000.

Z. Liu, M. Kim, V. Narayanan, and E.C. Kan, "Process and device characteristics of self–assembled metal nano–crystal EEPROM," Superlattices and Microstructures, vol. 28, pp. 393–9, 2000.

Z. Suo and Z. Zhang, Epitaxial films stabilized by long range forces, Phys. Rev. B, vol. 58, pp. 5116–20, 1998.

D.A. Bonnell, Y. Liang, M. Wagner, D. Carroll and M. Buhle, "Effect of size dependent interface properties on stability of metal clusters on ceramic substrates," Acta Mater., vol. 46, pp. 2263–70, 1998.

(List continued on next page.)

Primary Examiner—Phat X. Cao
Assistant Examiner—Theresa T. Doan
(74) Attorney, Agent, or Firm—Jones, Tullar & Cooper, PC

(57) ABSTRACT

Low resistance metal/semiconductor and metal/insulator contacts incorporate metal nanocrystals embedded in another metal having a different work function. The contacts are fabricated by placing a wetting layer of a first metal on a substrate, which may be a semiconductor or an insulator and then heating to form nanocrystals on the semiconductor or insulator surface. A second metal having a different work function than the first is then deposited on the surface so that the nanocrystals are embedded in the second material.

20 Claims, 7 Drawing Sheets

OTHER PUBLICATIONS

Z. Liu, V. Narayanan, M. Kim, G. Pei and E.C. Kan, "Low programming voltages and long retention time in metal nanocrystal EEPROM devices," 59th DRC Tech. Dig., pp. 79–80, 2001.

H.C. Lin, E.C. Kan, T. Yamanaka & C.R. Helms, "Modeling and characterization of Si/SiO2 interface roughness," VLSI Tech. Symp., Kyoto, Japan, Jun. 1997.

J. Kedzierski, P. Xuan, E.H. Anderson, J. Bokor, T.J. King and C. Hu, "Complementary silicide source/drain thin–body MOSFETs for the 20nm gate length regime," IEDM Tech. Dig., pp. 57–60, 2000.

J. Kedzierski, P. Xuan, V. Subramanian, E.H. Anderson, J. Bokor, T.J. King and C. Hu, "A 20–nm gate–length ultra–thin body p–MOSFET with silicide source/drain," Si Nanoelectronics Workshop, VLSI Tech. Symp., pp. 13–15, Honolulu, Hawaii, Jun. 2000.

C. Diorio, P. Hasler, B.A. Minch and C.A. Mead, "A floating–gate MOS learning array with locally computed weight updates," IEEE Trans. Electron Devices, vol. 44, pp. 2281–9, 1977.

* cited by examiner

EMBEDDED METAL NANOCRYSTALS

This application is a division of U.S. application Ser. No. 09/911,378, filed Jul. 25, 2001, now U.S. Pat. No. 6,646,302, which claims the benefit of U.S. Provisional Application No. 60/252,074, filed Nov. 21, 2000, the disclosure of which is hereby incorporated herein by reference.

This invention was made with Government support from the National Science Foundation (NSF) under Grant No. 9980100. The Government has certain rights in the invention.

FIELD OF THE INVENTION

The present invention relates, in general, to embedded metal nanocrystals for improving contact resistance and for enhancing tunneling current through a semiconductor/metal interface, or through a metal/insulator interface, and more particularly to the provision of metal nanocrystals embedded in another metal having a different work function to produce infringing electric fields at an interface with a semiconductor or insulator.

BACKGROUND OF THE INVENTION

The technology of low-resistance ohmic contacts is crucial to the manufacture of reliable VLSI systems. In conventional ohmic contacts, the reduction of a tunneling barrier (with or without surface Fermi level pinning) at the interface between a metal contact and a semiconductor is achieved by doping the semiconductor near the surface to degenerate levels. However, this technique hinges upon the availability of a reliable, shallow dopant, in the semiconductor, as well as a device structure that permits a high concentration of impurities at its surface.

The former criterion is not met easily for large band gap (e.g., p-type SiC) or organic semiconductors (e.g., MEH-PPV polymer). Furthermore, in device structures such as ultra-thin body silicide source/drain MOSFETs, which have been proposed as alternatives to the conventional MOSFET at nanometer gate lengths, the source-channel contact resistance in the ON state of the device is a significant problem. In these latter cases, the device structure does not allow the use of increased dopant concentration as a means to reduce the tunneling barrier width, since one of the prime advantages of these devices lies in the realization that they could eliminate the necessity of doping in CMOS technology altogether. It is, therefore, important to develop new schemes that can provide low resistance contacts even at modest doping levels, or can provide contacts which are totally doping independent.

SUMMARY OF THE INVENTION

Briefly, in accordance with the present invention, a novel contact is provided in which a metal/semiconductor or a metal/insulator contact resistance is reduced by more than 100 times over previously-available contact schemes. As described in detail below, the improved (reduced) contact resistance is obtained by forming, at a metal/semiconductor or a metal/insulator contact location, metal nanocrystals embedded in the metal contact layer. The nanocrystals and the metal contact layer have different work functions and, therefore, produce a large, built-in electric fringing field at the triple interfaces of the nanocrystals with the metal of the contact layer and the semiconductor or insulator substrate on which the contact is formed. The fringing field, which enhances tunneling through the potential barrier at the metal/semiconductor or metal/insulator interface, originates from the metal/nanocrystal interface and, therefore, is independent of the semiconductor impurity concentration. Furthermore, the dipole charge density in the metal is very high (it is inversely proportional to the Debye length in the metal) and will surpass the interface charge states within the metal-semiconductor interface.

The technique for forming the low resistance contact can be applied to large band gap semiconductors, but is also employed in low temperature TFTs, electronics on organic substrates, MEMS switches, and the like. When combined with a thin-body silicon-on-insulator (SOI) Schottky barrier MOSFET to reduce the ON state contact resistance, this contact scheme may be used to take MOSFET scaling to the 20 nm regime.

The low-resistance contact of the present invention may be fabricated, for example, by evaporating or sputtering on a clean, smooth Si(100) substrate surface a wetting layer of metal with an initial thickness ranging from 1–5 nm. This is done after a dilute HF etch of the surface. Thereafter, a rapid thermal annealing (RTA), ranging from 5 seconds to 2 minutes with a peak temperature near its bulk eutectic temperature with silicon, is performed in an inert ambient atmosphere. For certain metals, with proper selection of the annealing profile, nanocrystals are formed in the wetting layer at the silicon substrate surface (see, for example, Suo, et al, Physics Review 1998, B58, pps. 5116–5120). If a desired wetting layer metal does not self-assemble into the desired pattern of scattered, spaced, individual crystals of various diameters on the semiconductor substrate, then the desired crystal shapes can be obtained by using a pattern transfer from self-assembled anodic alumina nanohole arrays, or can simply be obtained by nano-lithography. After the nanocrystals are formed, a thick layer of contact (or cap) metal, around 0.5 to 1 $\mu$m, for example, with a different work function than that of the metal which was used for the nanocrystals, is evaporated or sputtered on the substrate surface without any significant substrate heating.

The basic embedded nanocrystal process described above is integrated with standard UV lithography steps to make contact resistance structures in which the work function difference between the nanocrystals and the contact metal sets up a large electric field which extends into the silicon substrate, close to the triple interface of the device. This triple interface is located where the contact metal, the nanocrystals and the semiconductor come together. The field is very similar to the fringing field between two capacitor plates. Because the materials retain their individual electrical properties in the nanoscale, the resulting electric field can be significantly higher than that produced in the original metal-silicon Schottky fields. There is, therefore, an electric field contour near the triple interface, in which the resulting potential barrier is significantly thinner than normal, thus enhancing field emission.

It is noted that in the foregoing process, the transport of metal atoms on the silicon surface is limited by temperature-dependent surface mobility, and growth is limited to the activated reaction/nucleation sites. The shape, size and spacing of the nanocrystals have dependence on wetting-layer thicknesses and their RTA profiles, as is the case for metal on silicon dioxide.

There are two competing processes during the RTA annealing step. The first is nanocrystal formation by minimization of the surface energy and the second is silicide formation by the metal-silicon reaction. Which process dominates depends on their relative rates. For materials like Ti, that can form suicides at temperatures much lower than their eutectic temperatures with silicon, a thin film of silicide is formed on annealing. This silicide film is less likely to form nanocrystals subsequently because of the gradual change in stiochiometry along the thickness of the film, which results in excellent adhesion to silicon. For other materials such as Au and Ag, however, the formation of nanocrystals is favored over the silicidation. Because the nanocrystal formation involves minimization of local total energy, metal diffusion and sintering into the silicon substrate is much less likely to happen.

The tunneling enhancement effect of the present invention is much larger in metal/insulator interfaces than in metal semiconductor interfaces, due to the larger barrier height normally encountered at insulator interfaces. The formation of metal nanocrystals on an insulator such as silicon oxide allows the nanocrystals to be used as floating gates instead of control gates. The work function difference between the nanocrystal and the contact, or cap, metal sets up a large electric field in the oxide close to the triple interface. As discussed above, a large density of dipole charges can be formed at the interface between two metals to produce a contour near the triple interface in which the potential barrier is significantly thinner than normal. The charge separation dies down over a few atomic lengths and the peak electric field also dies down relatively faster than the Debye length in the oxide. This is the ideal asymmetric situation for application of the invention to an EEPROM, since forward injection in such a device is much more enhanced, while backward leakage is not seriously affected at the barrier. This application to EEPROM devices resolves the requirement for high erase voltages in these devices, making EEPROM cells much more compatible with other CMOS device operations and provides easier technology scaling.

BRIEF DESCRIPTION OF THE DRAWINGS

The foregoing, and additional objects, features and advantages of the present invention will be apparent to those of skill in the art from the following detailed description of preferred embodiments, taken in conjunction with the accompanying drawings, in which.

DESCRIPTION OF PREFERRED EMBODIMENTS

Figure 1:
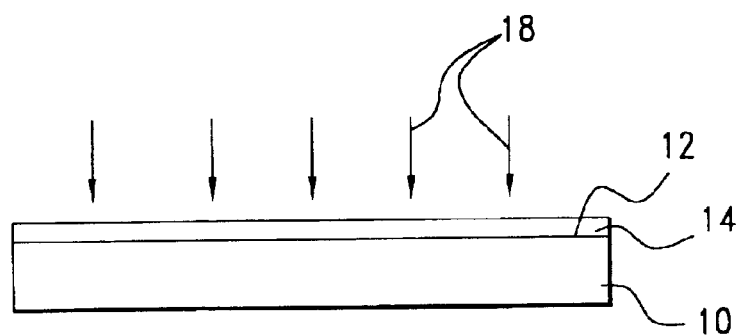
FIGS. 1, 2 and 4 illustrate a preferred process for fabricating a reduced resistance contact having nanocrystals in accordance with the invention.
Figure 2:
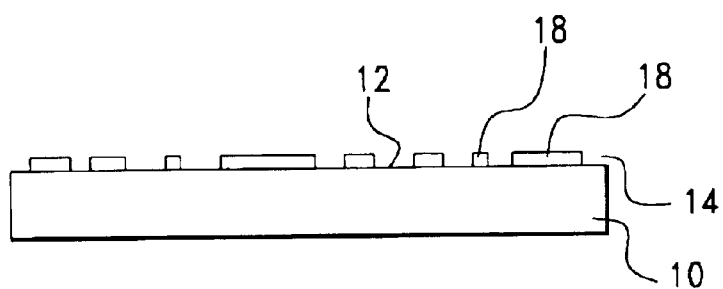

A process for fabricating oxide barriers, heterojunctions, and like metal oxide or metal/semiconductor interfaces for improving injection efficiency and reducing contact resistance is illustrated in FIGS. 1–4, to which reference is now made. As illustrated, a wafer 10 having a smooth and clean silicon (100) surface 12 is first cleaned with a dilute HF etch. Immediately thereafter, a wetting layer 14 of metal with an initial thickness ranging from 1–5 nm is evaporated or sputtered onto surface 12, as indicated by arrows 16. Thereafter, rapid thermal annealing (RTA) of layer 14, ranging from 5 seconds to 2 minutes, with a peak temperature near its bulk eutectic temperature with silicon, is performed in an inert ambient. For certain metals, such as Au, a proper selection of the annealing profile of the RTA, will result in the formation of nanocrystals 18 at the silicon surface 12, as illustrated in FIG. 2. In this annealing process, the transport of metal atoms on the silicon surface 12 is limited by their temperature-dependent surface mobility, and growth is limited to the activated reaction/nucleation sites so that spaced nanocrystals 18 are formed. The size, shape and spacing of nanocrystals on a silicon surface have the same dependence on wetting-layer thicknesses and RTA profiles as is the case for metal on a silicon dioxide surface.

Figure 3:
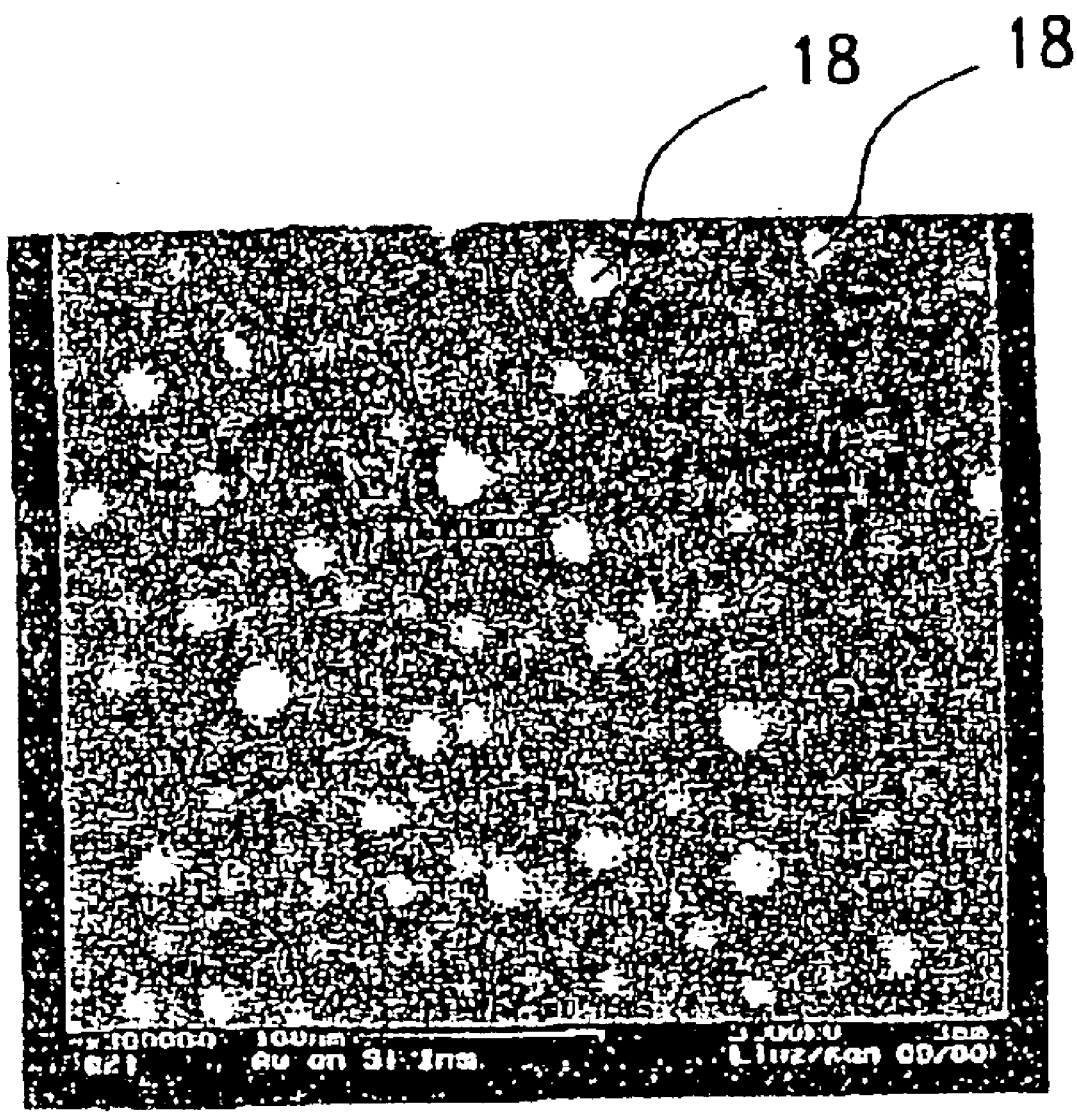
FIG. 3 is a top plan view of a substrate carrying a multiplicity of Au nanocrystals.

FIG. 3 is a scanning electron microscope (SEM) image, in top plan view, of Au nanocrystals 18 formed in an Au wetting layer 14 on a silicon substrate 10. In this case, the nanocrystals were formed from a 1 nm thick wetting layer after a 2-minute RTA at 600° C. The largest of the nanocrystals, shown as white dots in the image, has a diameter close to 16 nm.

During the RTA annealing step, two competing processes occur. One is the formation of nanocrystals by the minimization of surface energy and the other is the formation of silicide caused by the metal-silicon reaction. Whichever process dominates depends on their relative rates. Thus, for example, materials like Ti that can form suicides at temperatures much lower than their eutectic temperatures with silicon, will produce a thin film of silicide upon annealing. This suicide film is less likely to form nanocrystals because of the gradual change in stiochiometry along the thickness of the film, which results in excellent adhesion to the silicon. For other materials, such as Au, Ag, and the like, the formation of nanocrystals is favored over the formation of a silicide film. Because the nanocrystal formation involves minimization of local total energy, metal diffusion and sintering into the silicon substrate is much less likely to occur. This is corroborated by monitoring channel mobility in nanocrystal MOSFET structures.

Figure 4:
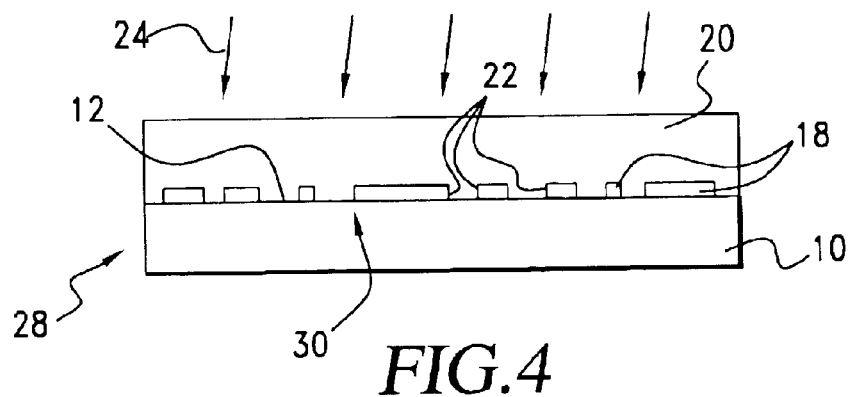

As illustrated in FIG. 4, after the nanocrystals 18 are formed, a thick layer 20 of metal, having a work function different than that of the metal which formed layer 14 and the nanocrystals 18, is sputtered onto the silicon substrate 10 and onto the nanocrystals 18, producing a cap layer or contact layer 20 of metal about 0.5 to 1.0 $\mu$m thick, without significant substrate heating. The metal layer 20 surrounds and embeds the metal nanocrystals 18, with the metal 20 contacting the metal 18 at interfaces 22 surrounding each nanocrystal, and contacting the substrate at its surface 12 between the nanocrystals. This produces the contact structure 28 illustrated in FIG. 4, which may then be subjected to standard ultraviolet lithography steps to make contact resistance structures of arbitrary shapes and sizes.

Figure 5:
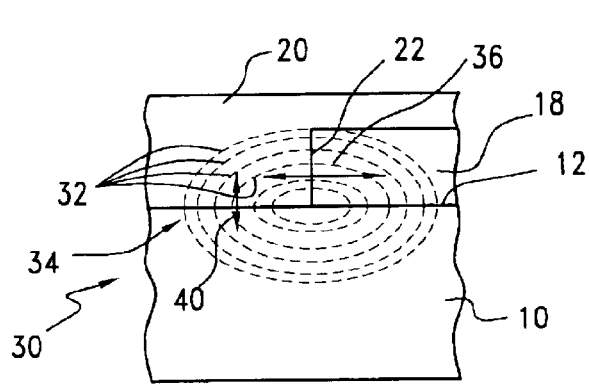
FIG. 5 is an enlarged view of a triple interface between two dissimilar metals and a substrate.

FIG. 5 is an enlarged view of a triple interface region 30 of the contact 28, which is at the intersection of the silicon substrate surface 12 and any of the interfaces 22 which occur where the edges of the nanocrystals 18 meet the metal layer 20. In this region, the work function difference between the two metals 18 and 20 sets up a large electric field 32 which extends into the silicon substrate 10, in the triple interface region 30. This field is very similar to the fringing field between two capacitor plates. If the materials, 10, 18 and 20 retain their individual properties, the resulting electric field can be significantly higher than original metal-silicon Schottky fields. There is, therefore, a field contour generally indicated at 34 in FIG. 5, in the triple interface region 30, in which the metal 20-silicon 10 barrier at surface 12 is significantly thinner than normal, thereby enhancing field emission from the metal layer into the silicon or from the silicon into the metal layer, in that region.

Because of the difference in work function of the metals 18 and 20, opposite charges accumulate on opposite sides of the metal-to-metal interface 22, but this charge separation can be assumed to die down over a few atomic lengths. The DeBye length in the semiconductor 10 is, however, considerably larger than this charge separation length, since the charge density in a metal is much higher than in the semiconductor 10, even at the practical degenerate doping limits. Accordingly, the peak lateral field, indicated by arrow 36, across the interface 22 and between metals 18 and 20 in the location of the triple interface 30, would be nearly independent of the doping level in the semiconductor 10, since the field lines 32 originate in one metal and terminate in the other, and not in the semiconductor. The curvature of the field, or potential, lines 32, however, is determined by the doping level in the semiconductor 10.

The electric field 32 has a vertical field component, indicated by arrow 40, which is perpendicular to the metal-silicon interface at surface 12, and this component will have different values for differently-doped substrates. However, since the lateral field 36 is much greater than the vertical field 40, the peak electric field is nearly doping independent.

Figure 6:
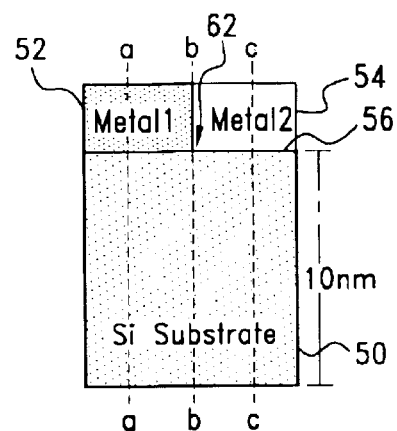
FIG. 6 is a diagrammatic enlarged cross section at a triple interface of the device of FIG. 5, with cut lines a, b and c showing the locations of E-field plots.
Figure 7:
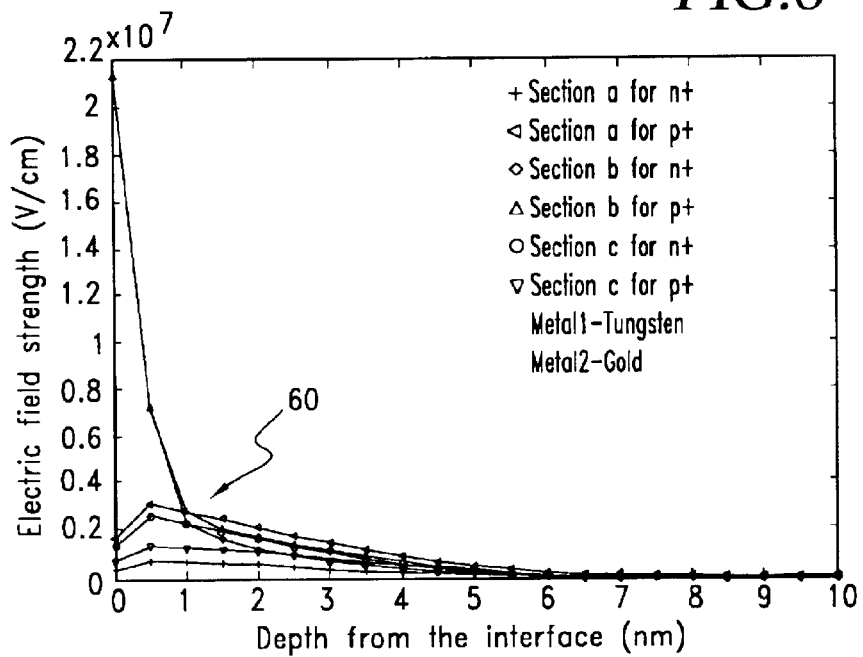
FIG. 7 is a graphic illustration of the peak electric field as a function of depth into a silicon substrate for the locations a, b and c of FIG. 6, for a tungsten-gold metal interface on a silicon substrate.

An evaluation of the electric field enhancement at the metal-semiconductor interface 12 was carried out utilizing a two-dimensional simulation with ATLAS software (ATLAS Software Manual, Silvaco International, 1997). The simulated device, illustrated in FIG. 6, consisted of a silicon substrate 50 with two metal electrodes 52 and 54 of different work functions on the top surface 56 of the substrate 50. The test results are plotted in FIG. 7 by graph 60, which shows the electric field strength at varying depths from the interface within the silicon 50 at sections a, b and c of FIG. 6. The results illustrated by graph 60 clearly show an increased electric field near the triple interface 62 (FIG. 6), as compared to a normal metal/silicon interface such as that found at Sections a and c of the device of FIG. 6.

Figure 8:
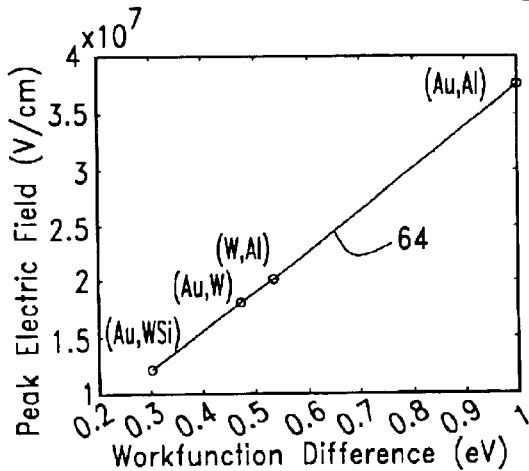
FIG. 8 illustrates results for the peak electric field at a distance of 0.2 nm for a Metal1–Metal2-Si Substrate triple interface, as a function of the work function difference between metals.

FIG. 8 graphically illustrates at 64 the peak electric field increases monotonically with the work function difference between different metals.

Figure 9:
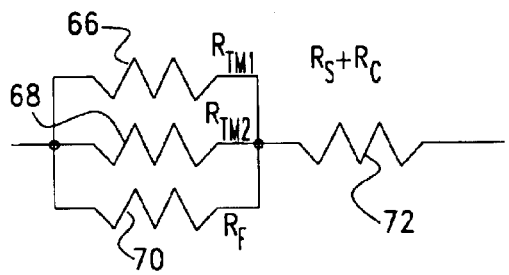
FIG. 9 is an equivalent circuit for the structure of FIG. 4, wherein $R_{TM1}$ and $R_{TM2}$ model thermionic emission from Metals $M_1$ and $M_2$, respectively, $R_F$ models the enhanced field emission component, and $R_s$, and $R_c$ represent the sheet resistance of silicon and the current crowding effect.

Enhanced tunneling currents across the interface 56 (FIG. 6) are obtained at the cost of some extra series resistance due to current crowding, as illustrated in the equivalent circuit of FIG. 9. In this illustration, resistors 66 and 68 model the thermionic emission from metals 52 and 54, respectively, with the thermionic emission increasing with temperature. The resistor 70 models the enhanced field-emission component, which is practically independent of temperature, while resistor 72 represents the sheet resistance of the silicon, which increases with temperature as well as with the current crowding effect.

The tunneling enhancement produced by the interface fields, such as field 32, caused by embedded nanocrystals is in addition to that provided by interface geometrical features. Further, the tunneling cross section is proportional to the sum of the perimeters of all the nanocrystals in the contact region. Further roughening of the surface, with the roughness metric being smaller than the average nanocrystal diameter, enhances the tunneling effect even further because of the mixing of lateral and vertical electric fields caused by geometrical curvatures.

As illustrated in FIGS. 10–15, many combinations of semiconductors and metals demonstrate the tunneling-enhancement effect produced by the fringing fields illustrated, for example, at 32 in FIG. 5. For these Figures, gold (Au) dots were embedded in tungsten (W) and in tungsten Silicide ($WSi_2$) in a simplified MOSFET process, with the graphs of FIGS. 10 through 15 illustrating measurement data for metal contacts to n+ and p+ silicon substrates, as well as to n+ polysilicon. The surface doping levels were about $10^{20}$ cm$^{-3}$ for n+ Si/Poly and $10^{19}$ cm$^{-3}$ for p+ Si. Contact sizes were 2×2 $\mu$m for n-type and 8×8 $\mu$m for p-type.

Figure 10:
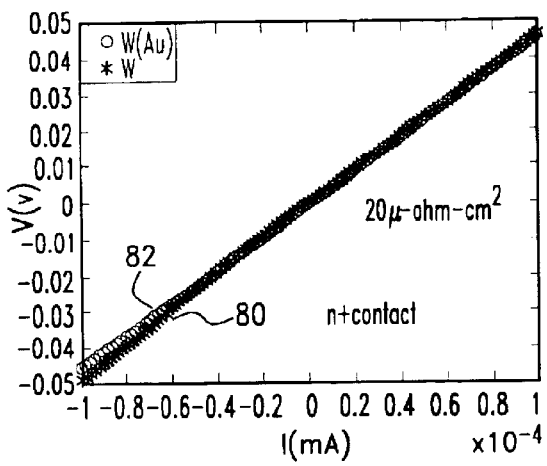
FIG. 10 illustrates measured I-V characteristics of a direct tungsten contact with an n$^+$ silicon substrate and a tungsten contact having gold nanocrystals.

Curve 80 in FIG. 10 illustrates measured current-voltage (I-V) characteristics of a direct tungsten contact (which may form $WSi_2$), while curve 82 illustrates the measured I-V characteristics of a tungsten contact having embedded gold nanocrystals, both materials being in contact with n+ silicon. The results indicated by curves 80 and 82 show the improvement produced by the nanocrystals over inherently good contacts.

Figure 11:
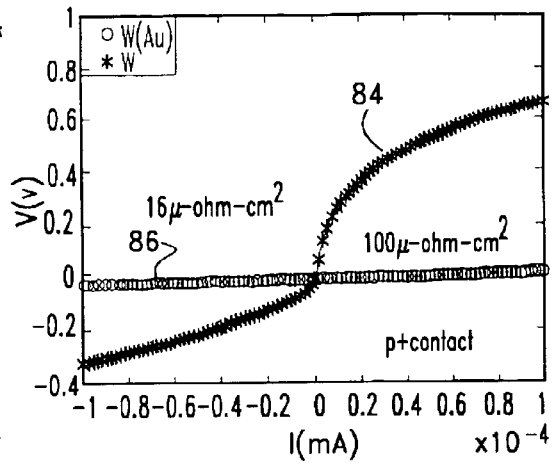
FIG. 11 illustrates the measured characteristics of a direct tungsten contact and a tungsten-gold nanocrystal contact with p$^+$ silicon substrate.

The measured current-voltage characteristics of a tungsten contact with p+ silicon are illustrated by curve 84 in FIG. 11, while the characteristics of a Tungsten contact having embedded Au nanocrystals in contact with the same p+silicon are illustrated by curve 86 in that figure. The Schottky nature of the contact illustrated by curve 84 disappears in curve 86, showing an improvement by a factor of nearly 160.

Figure 12:
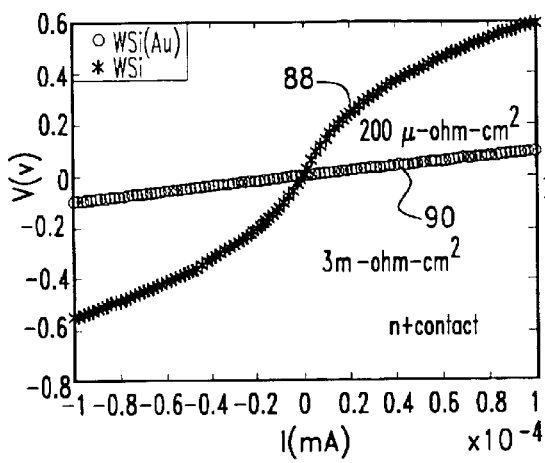
FIG. 12 illustrates the improvement in contact resistance of a highly Schottky contact, having a large Schottky interface potential barrier, formed by sputtering a thin layer of intrinsic Si between an n$^+$ substrate and a tungsten-silicon contact layer.

An improvement in contact resistance for a highly Schottky contact can be obtained by sputtering a thin layer of intrinsic silicon between an n+ substrate and a Tungsten-Silicon contact layer, as illustrated at curve 88 in FIG. 12, which represents the current-voltage characteristics for these materials. Curve 90 represents the current-voltage characteristics for a Tungsten-Silicon layer embedded with gold nanocrystals. As illustrated, the material incorporating nanocrystals has a significantly reduced contact resistance.

Figure 13:
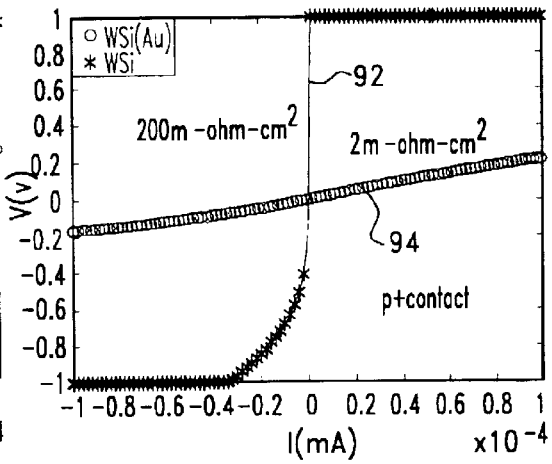
FIG. 13 illustrates the improvement in contact resistance for a structure similar to that used for FIG. 12, but using a p$^+$ substrate.

FIG. 13 illustrates at curves 92 and 94 an improvement of the contact resistance by 100 times for materials identical to those of FIG. 12, except that the n+ substrate is replaced by a p+ substrate.

Figure 14:
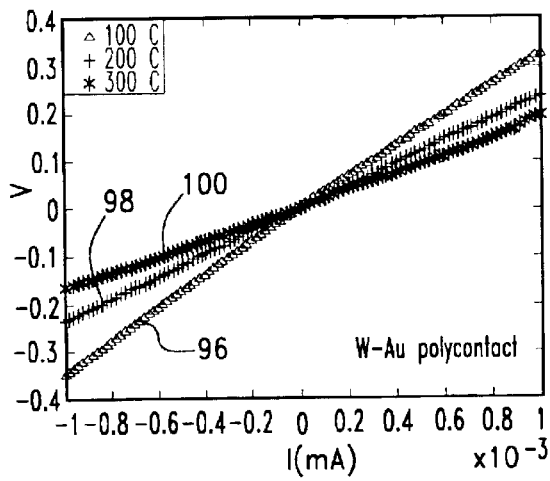
FIG. 14 illustrates the temperature dependence of the I-V characteristics of a contact utilizing nanocrystals in accordance with the invention.

The weak temperature dependence of current-voltage characteristics for a cap layer of Tungsten containing Gold nanocrystals in contact with a polysilicon layer is indicated in FIG. 14, where curve 96 represents measurements taken at 100° C., curve 98 represents measurements made at 200° C., and curve 100 represents measurements taken at 300° C. The weak temperature dependence illustrated by these curves indicates a dominant tunneling component due to barrier thinning in the presence of high electric fields in the particle transport at the contact.

Figure 15:
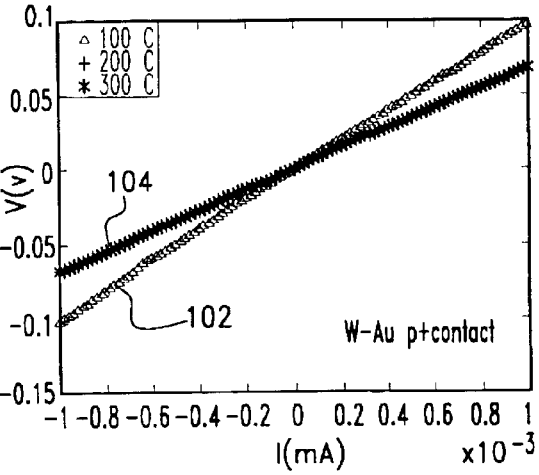
FIG. 15 illustrates the relatively temperature insensitive I-V characteristics of a tungsten contact having gold nanocrystals in contact with p$^+$ silicon.

FIG. 15 illustrates the relative temperature insensitivity of current-voltage characteristics of a Tungsten-Gold contact with p+ silicon, curve 102 representing measurements taken at 100° C. and curve 104 representing measurements taken at 300° C.

As illustrated in these drawings, the field-enhancement effect is very strong for a large Schottky-like contact resistance, and this effect provides an improvement in the contact resistance by more than two orders of magnitude. When a good ohmic tunneling contact can be formed between the bulk metal and the semiconductor, this field enhancement effect has a much smaller influence on contact resistance. The contact resistance measurements made at different temperatures confirm that enhanced tunneling is obtained, and the weak dependence of the contact resistance on temperature suggests a dominant tunneling component. The slight increase in contact resistance due to temperature can be attributed to the intrinsic heat resistance (FIG. 9) which increases with temperature.

Contacts utilizing the nanocrystal technology described above can be applied to Schottky-contact MOSFETs and heterojunction bipolar transistors to reduce the series resistance components. The technology can also be applied to thin film transistors where high complementary doping in amorphous silicon is difficult, as well as to some types of organic light-emitting diodes, where the quantum efficiency is limited by carrier injection.

Figure 16:
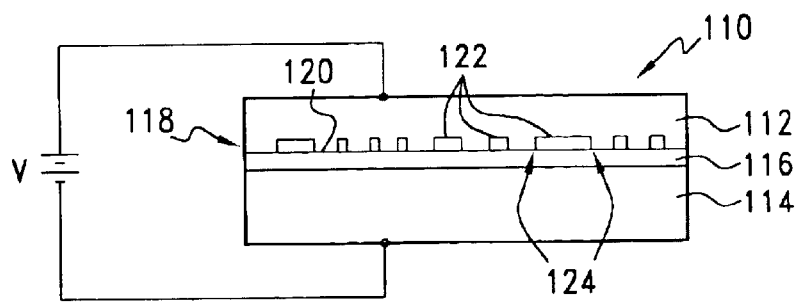
FIG. 16 illustrates a capacitor utilizing the nanocrystals of the present invention.

The use of enhanced electric fields from metal nanocrystals embedded in another metal with a different work function, as described above, can be used to significantly enhance the tunneling current through a metal/insulator interface, as illustrated in capacitor 110 (FIG. 16). The capacitor 110 incorporates upper and lower metal layers 112 and 114 separated by an insulating layer 116, as is conventional. In addition, the capacitor 110 incorporates a nanocrystal layer 118 fabricated in the manner described above with respect to FIGS. 1–4. The gate currents in MOS capacitor structures such as that illustrated in FIG. 16 were measured and showed a tremendous improvement of injection efficiency.

The basic theory for the enhanced tunneling over the metal/insulator interface 120 of the capacitor 110 is very similar to the contact resistance improvement described above. The tunneling enhancement effect is much larger due to the larger barrier height at interface 120, but the formation of metal nanocrystals on silicon oxide is very similar to that described above for the formation of nanocrystals on a semiconductor or on metal. Thus, the nanocrystals 122 of layer 118 are formed on the top surface 120 of oxide layer 116, and the upper (cap) metal layer 112 of the capacitor is then deposited over the nanocrystals to produce triple interfaces at the edges of the nanocrystals; for example, at region 124 in FIG. 16. The work function difference between the nanocrystals 122 and the cap metal 112 establishes a large electric field 123 (See FIG. 17) in the oxide layer 116 close to the triple interfaces 128 at each nanocrystal, as illustrated in regions 124, shown in enlarged view in FIG. 17.

Figure 17:
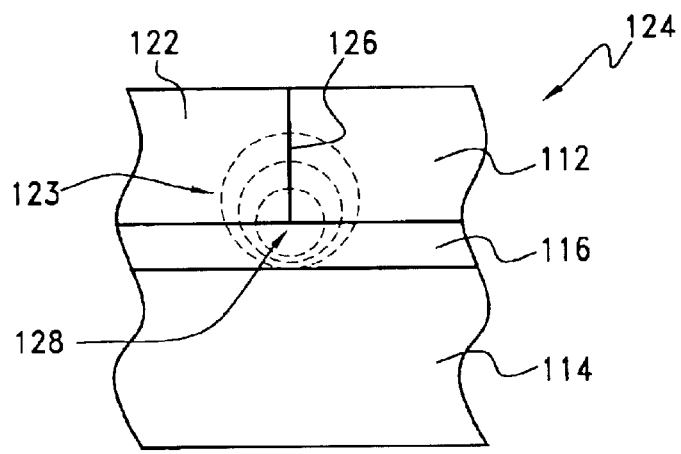
FIG. 17 illustrates fringing fields at a triple interface.

The field 123 is very similar to the fringing field between two capacitor plates so that materials which retain their individual electrical properties in the nanoscale form a large density of dipole charges at the interface 126 between the two metals 122 and 112, as illustrated in FIG. 17. Thus, as described above, there is a field contour near the triple interface 128 in which the barrier is significantly thinner than normal, thus enhancing field emission of carriers between the oxide layer 116 and metal layer 122. The charge separation at the metal/metal interface 126 can be assumed to die down over a few atomic lengths as described above, and the peak electric field in the oxide 116 also dies down relatively faster than the Debye length in the oxide due to the nature of the dipole charge. This is an ideal asymmetric situation for use in EEPROM applications, one of which is as illustrated in FIG. 18, since forward injection is enhanced by the fringing field while backward leakage is not seriously affected.

Figure 19:
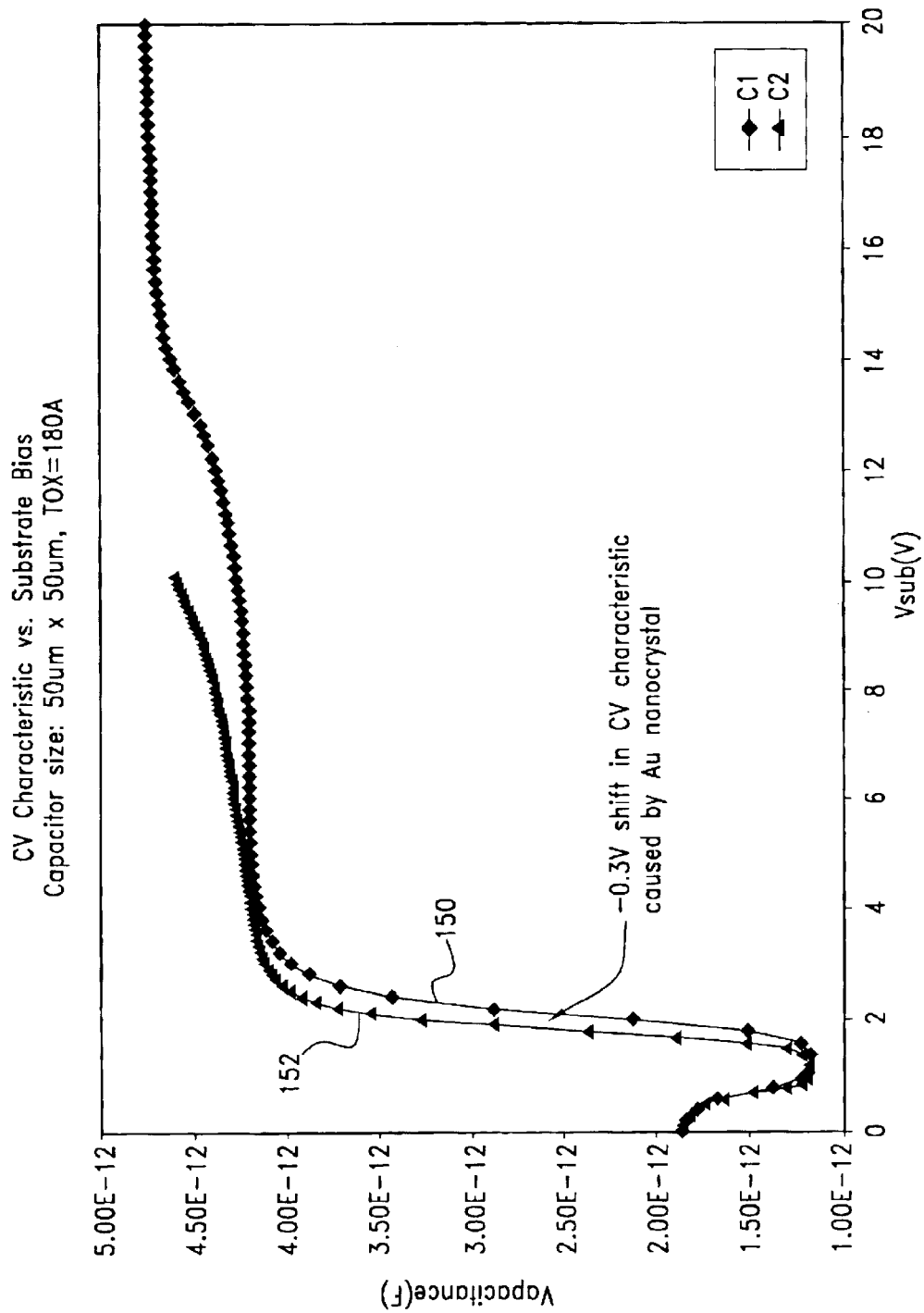
FIG. 19 illustrates capacitance-voltage curves representing the formation of nanocrystals.
Figure 20:
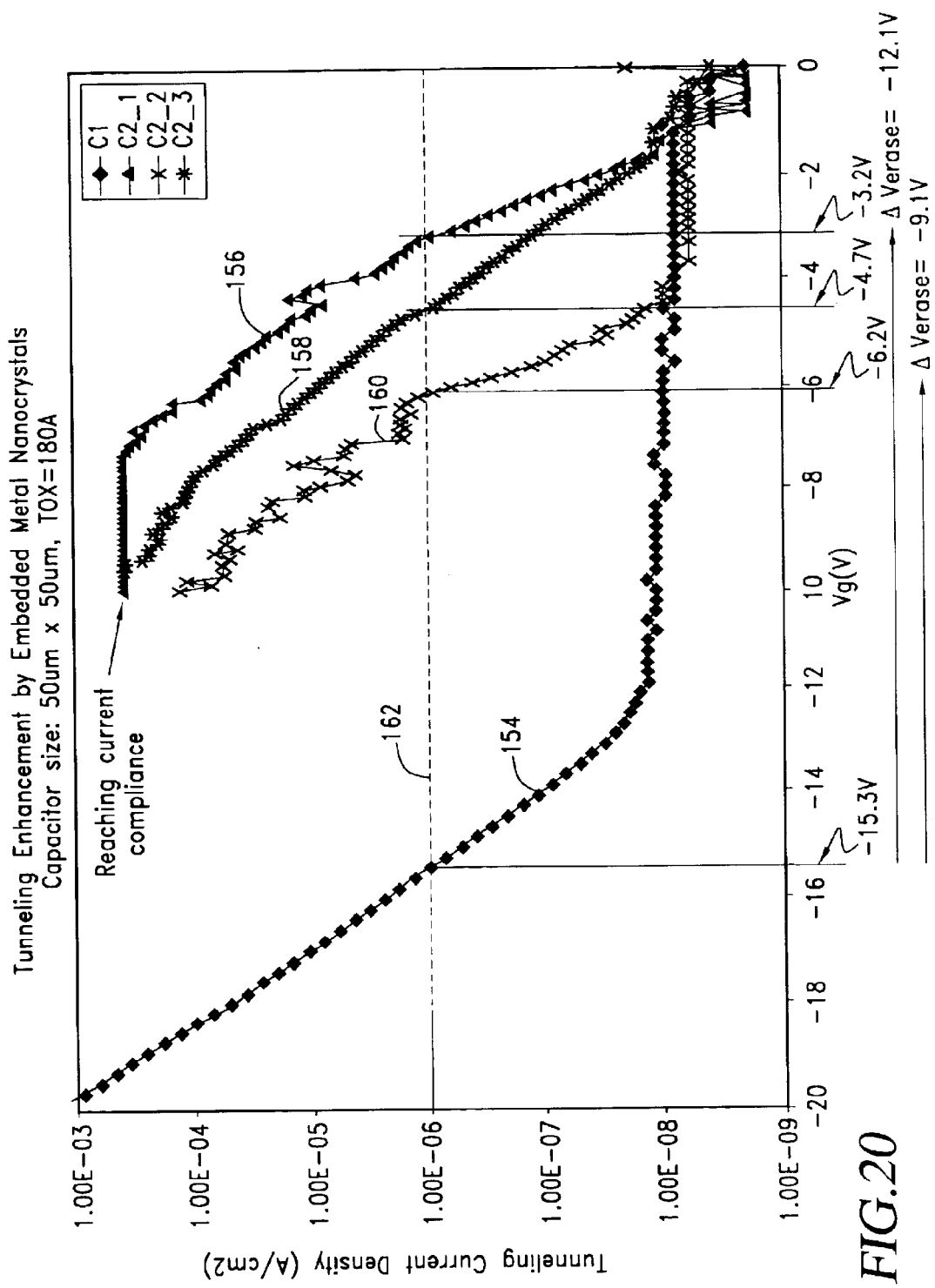
FIG. 20 illustrates tunneling currents through a capacitor.

In FIG. 19, the MOS capacitance-voltage curves 150 and 152 illustrate the formation of nanocrystals. The work function difference in the nanocrystal and cap metals is approximately 0.9 V and this would be expected to cause a 0.9 V shift in the capacitance vs. voltage curve if nanocrystals had not been formed. However, a shift of 0.3 V was observed, which corresponds to nanocrystals formed on about 30% of the metal/oxide interface. In FIG. 20, tunneling currents through the MOS capacitor 110 are shown for different voltages applied across the capacitor. Without the embedded nanocrystals, the tunneling current is illustrated by curve 154; curves 156, 158 and 160 illustrate the results obtained for different densities and geometries of embedded nanocrystals. As illustrated in this figure, a voltage of, for example, 15.3 V is required to obtain the constant current illustrated by line 162 in the absence of nanocrystals, as illustrated by curve 154. However, to obtain that same current in a capacitor having the three nanocrystal densities represented by curves 156, 158 and 160 requires only 3.2 V, V, 4.7 V, or 6.2 V, respectfully. Thus, to obtain a constant current level through the capacitor, the use of nanocrystals can result in a reduction of as much as 12.1 volts in these examples.

Figure 18:
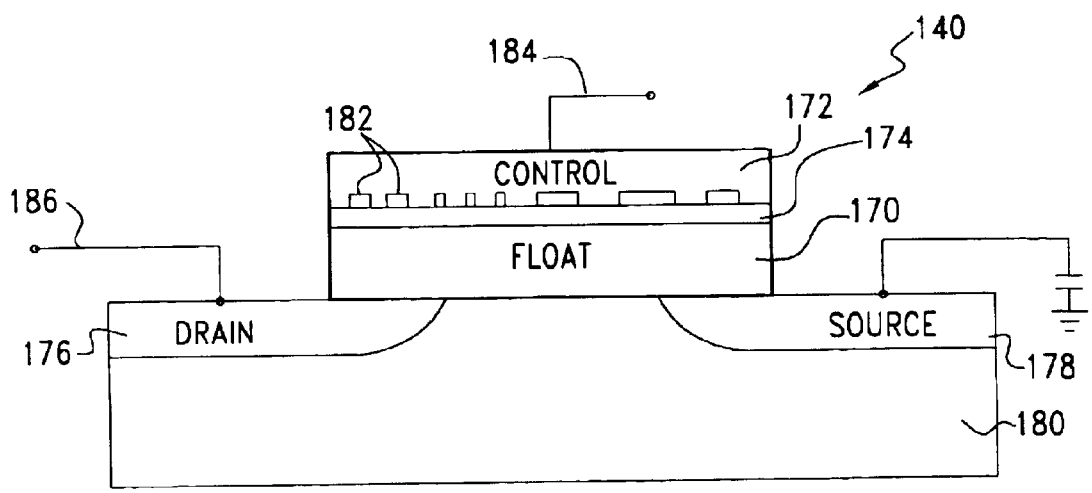
FIG. 18 illustrates the use of nanocrystals embedded in a metal having a different work function in an EEPROM.

The EEPROM (electrically erasable programmable read only memory) illustrated at 140 in FIG. 18 utilizes the nanocrystal structure described above with respect to FIG. 16. The illustrated EEPROM device is one example of an EEPROM suitable for use with the nanocrystal of the invention, and includes a floating gate 170 and a control gate 172 separated by a thin oxide layer 174, with current flow through the device being regulated by drain 176 and source 178 regions in a silicon substrate 180. In accordance with the present invention, nanocrystals 182 are formed at the interface between control gate 172 and oxide layer 174. The floating gate 170 is connected to the output line 184 of the device only through the control gate 172. As long as the floating gate 170 is linked to the output line 184 through control gate 172, the illustrated EEPROM may be said to have a value of "1".

To switch the device 140 to a "0" condition, an electrical charge, usually 10 to 13 V, is applied to the floating gate from drain line 186. This charge causes the floating gate 170 to act like an electron gun, causing excited electrons to be pushed through and trapped on the other side of the thin oxide layer 174, giving the layer a negative charge. These negatively charged electrons act as a potential barrier between the control gate and the floating gate, preventing current flow from the floating gate to output line 184.

To return the EEPROM to its normal "1" condition an "erase" voltage charge must be applied to the control gate to remove the blocking charges on oxide layer 174. This erase voltage is normally in the range of 12–15 V; however, for a given gate current level, FIG. 20 illustrates that, with the use of the nanocrystals 182, the required voltage to produce a given gate current level is significantly reduced; for example from 15.3 V to 3.2 V. Since the high density of dipole charges blocking current flow are on the control gate side of oxide layer 174, and since the current flow enhancement produced by the nanocrystals only increases the high density of dipole charges on the control gate side of the oxide layer, the electric field in the floating gate side 170 during the retention of electrons is almost untouched; that is, the retention characteristics of the EEPROM device will be least affected by introducing the nanocrystals 182. However, this same characteristic reduces the erase voltage required for the EEPROM, for the electric field produced by the nanocrystals allows a reverse voltage applied to line 184 to produce a flow of electrons back through the oxide layer 174 and to ground, reducing the barrier at oxide layer 174 and returning the state of the device to "1". The enhancement provided by the nanocrystals allows this erasure of the barrier by a much lower voltage; in the range of 3.2 V instead of 15 V, making the EEPROM cell much more compatible with other CMOS device operations and provides great advantages for continuous technology scaling. Various other EEPROM devices such as devices with different doping polarities, may also be provided with improved barrier conditions by use of the nanocrystals of the invention.

Thus there has been disclosed a novel contact scheme that utilizes the high electric field at the interface of metals with different work functions to increase tunneling across semiconductor/metal barriers and metal/oxide barriers. The nanocrystal devices make the field doping independent and provide great advantages over prior devices. Although the invention has been described in terms of preferred embodiments, it will be apparent that numerous variations and modifications may be made without departing from the true spirit and scope thereof, as set forth in the following claims.

What is claimed is:

1. A method of fabricating low resistance contacts, comprising:
    depositing a thin layer of a first metal having a first work function on a substrate surface;
    heating the first metal layer to form nanocrystals of said first metal on said surface; and
    depositing a thick layer of a second metal having a second work function on said surface to embed said nanocrystals in said second metal.

2. The method of claim 1, further including lithographically patterning said second metal layer to form a metal contact of predetermined shape.

3. The method of claim 1, wherein depositing said first metal includes vapor deposition of the first metal to a thickness of between about 1 nm and about 5 nm.

4. The method of claim 1, further including etching said substrate surface before depositing said first metal.

5. The method of claim 1, wherein heating the first metal layer includes heating with a peak temperature at about its bulk eutectic temperature in an inert ambient.

6. The method of claim 1, wherein depositing said second metal layer includes vapor deposition of the second metal to a thickness of about 0.5 to about 1 micrometer.

7. The method of claim 1, wherein depositing said first metal on a substrate includes providing a semiconductor having clean and smooth Si(100) surface for receiving said deposited first metal layer.

8. The method of claim 7, wherein depositing said first metal includes vapor deposition to a thickness of between about 1 nm and about 5 nm.

9. The method of claim 8, wherein heating the first metal includes heating to a peak temperature of about its bulk eutectic temperature.

10. The method of claim 9, wherein depositing said second metal layer includes vapor deposition of the second metal to a thickness of about 0.5 to about 1 micrometer.

11. The method of claim 1, wherein depositing said first metal on a substrate includes first providing an oxide layer on said substrate surface and thereafter depositing said thin layer of a first metal on said oxide layer.

12. The method of claim 11, wherein depositing said thin layer includes vapor deposition of said first metal to a thickness of between about 1 nm and about 5 nm.

13. The method of claim 12 wherein heating said first metal includes heating to a peak temperature of about the bulk eutectic temperature of said first metal.

14. The method of claim 13, wherein depositing said second metal layer includes vapor deposition of the second metal to a thickness of about 0.5 to 1 micrometer.

15. The method of claim 1, wherein said nanocrystals are spaced apart on said surface and wherein depositing said second metal includes deporting it on said surface between said nanocrystals and on said nanocrystals to embed said nanocrystals and to produce triple interfaces between the edges of said nanocrystals, said surface, and said second metal, the first and second work functions of said first and second metals producing electric fields extending into said substrate.

16. The method of claim 1, wherein said substrate is electrically insulating and further including fabricating a metal layer on a bottom surface of said insulating substrate to produce a capacitor.

17. The method of claim 1, further including:
    forming said substrate as a thin oxide layer on a metal layer, said nanocrystals being formed on a top surface of said oxide layer, and
    forming said substrate on a semiconductor base having source and drain regions.

18. The method of claim 17, further including connecting said first layer and said source and drain regions to produce current flow regulated by said source and drain regions, whereby said substrate metal layer is a floating gate and said first metal layer is a control gate.

19. A method of fabricating a semiconductor device, comprising:
    forming spaced nanocrystals on a top surface of an oxide layer on a metal substrate, said nanocrystals being formed of a first metal having a first work function;
    depositing a layer of a second metal having a second work function on said nanocrystals and on said top surface of said oxide layers to embed said nanocrystals and to produce electric fields in said oxide layer at triple interfaces where said nanocrystals and said second metal contact said oxide layer; and locating said metal substrate on a semiconductor base having source and drain regions to form an EEPROM device.

20. The method of claim 19, further including connecting an electrical contact to said second layer to produce current in said device controlled by said source and drain regions.

* * * * *